(12) United States Patent
Bobde et al.

(10) Patent No.: US 12,295,166 B2
(45) Date of Patent: May 6, 2025

(54) HIGH DENSITY SHIELD GATE TRANSISTOR STRUCTURE AND METHOD OF MAKING

(71) Applicant: Alpha and Omega Semiconductor International LP, Toronto (CA)

(72) Inventors: Madhur Bobde, Sunnyvale, CA (US); Sik Lui, Sunnyvale, CA (US); Lei Zhang, Portland, OR (US); Xiaobin Wang, San Jose, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 577 days.

(21) Appl. No.: 17/581,796

(22) Filed: Jan. 21, 2022

(65) Prior Publication Data

US 2023/0238440 A1    Jul. 27, 2023

(51) Int. Cl.
*H01L 29/423* (2006.01)
*H10D 62/17* (2025.01)
*H10D 64/27* (2025.01)
*H10D 84/01* (2025.01)
*H10D 84/03* (2025.01)

(52) U.S. Cl.
CPC ......... *H10D 64/513* (2025.01); *H10D 62/393* (2025.01); *H10D 84/0144* (2025.01); *H10D 84/038* (2025.01)

(58) Field of Classification Search
None
See application file for complete search history.

(56) References Cited

U.S. PATENT DOCUMENTS

| | | |
|---|---|---|
| 5,998,833 A | 12/1999 | Baliga |
| 6,132,631 A | 10/2000 | Nallan et al. |
| 7,667,269 B2 | 2/2010 | Tsuzuki et al. |
| 9,136,377 B2 | 9/2015 | Lee et al. |
| 9,799,743 B1 | 10/2017 | Li et al. |
| 9,847,395 B2 * | 12/2017 | Laforet ............... H01L 29/404 |
| 11,245,016 B2 | 2/2022 | Sheridan et al. |
| 2009/0127617 A1 * | 5/2009 | Shin ............... H01L 29/66734 257/E21.409 |
| 2016/0027913 A1 * | 1/2016 | Shin ............... H01L 21/31144 438/270 |
| 2019/0326433 A1 * | 10/2019 | Sumida ............ H01L 29/0696 |
| 2022/0336594 A1 * | 10/2022 | Haase ............. H01L 21/28052 |
| 2023/0343871 A1 * | 10/2023 | Karner ............ H01L 29/42376 |
| 2024/0162334 A1 * | 5/2024 | Mrinal ............. H01L 29/401 |

* cited by examiner

*Primary Examiner* — Long Pham
(74) *Attorney, Agent, or Firm* — JDI PATENT; Joshua D. Isenberg

(57) ABSTRACT

A device and a method of making the device comprising, a semiconductor substrate layer and an epitaxial layer formed on the semiconductor substrate. One or more trenches are formed in the epitaxial layer, each trench having a pair of opposing sidewalls, wherein a distance between the opposing sidewalls is greater near a bottom of the trench than near a top of the trench, wherein the bottom of the trench is closer to the semiconductor substrate layer than the top.

9 Claims, 13 Drawing Sheets

HIGH DENSITY SHIELD GATE TRANSISTOR STRUCTURE AND METHOD OF MAKING

FIELD OF THE INVENTION

Aspects of the present disclosure are related to semiconductor power devices. Specifically aspects of the present disclosure are related to trench gate semiconductor power devices and Shield Gate transistors.

BACKGROUND OF THE INVENTION

In current Shield Gate Transistor (SGT) structures, the pitch between gates is limited by the width of the source contact regions. The source contact region must be large enough that a source metal contact can be made to the source contact region with low resistance. Topologies of current gate structures prevent a reduction in pitch because the gate electrodes are substantially wider than the shield electrode in the gate trench and this prevents a reduction in pitch as the moving the gates closer together shrinks the source contact region. This causes a decrease in alignment tolerance between the source contact and the gate, which could potentially cause gate to source leakage and variation in threshold voltage because of contact implant getting into the channel. Additionally, simply shrinking the SGT trench leads to an undesirable shrinkage of the shield electrode, which increases the shield electrode to source electrode series resistance that could result in lower breakdown voltage during fast switching. It also increases processing complexity resulting from oxide and polysilicon film depositions in higher aspect ratio trenches.

It is within this context that aspects of the present disclosure arise.

BRIEF DESCRIPTION OF THE DRAWINGS

The teachings of the present disclosure can be readily understood by considering the following detailed description in conjunction with the accompanying drawings, in which:

FIGS. 5O'-5S' depicts side cut-away views of the method of making the improved Trench FET device according to aspects of the present disclosure.

DESCRIPTION OF THE SPECIFIC EMBODIMENTS

Figure 1:
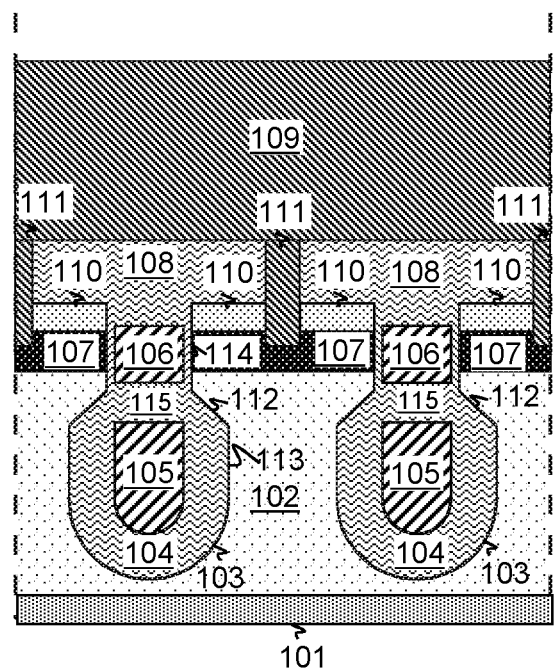
FIG. 1 is a side cross-sectional view of the improved SGT having a shield electrode width that is equal to the width of a gate electrode according to aspects of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the interest of clarity, not all of the routine features of the implementations described herein are shown and described. It will be understood by those skilled in the art that in the development of any such implementations, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of the present disclosure.

This disclosure herein refers to semiconductors doped with ions of a first conductivity type or a second conductivity type. The ions of the first conductivity type may be opposite ions of a second conductivity type. For example and without limitation the first conductivity type may be an n-type and second conductivity type may be p-type or vice versa. Ions of the first or second conductivity are ions, that when impregnated into the semiconductor material causes the semiconductor material to have the corresponding conductivity type. For example and without limitation n-type ions may be ions that induce electrons as charge carriers when doped into the semiconductor material. N-type ions include phosphorus, antimony, bismuth lithium and arsenic for silicon based semiconductors. P-type ions may be ions that induce holes as charge carriers when doped into the semiconductor material. P-type ions include boron, aluminum, gallium and indium.

In the following Detailed Description, references are made to accompanying drawings which form a part hereof and in which is shown by way of illustration specific embodiments in which the invention may be practiced. For convenience, use of + or − after a designation of conductivity or net impurity carrier type (p or n) refers generally to a relative degree of concentration of the designated type of impurity carriers with a semiconductor material. In general, terms, an n+ material has a higher n type net dopant (electron) concentration than an n material, and an n material has a higher carrier concentration than an n− material. Similarly, a p+ material has a higher p type net dopant (hole) concentration than a p type material, and a p type material has a higher concentration than a p− material. It is noted that, what is relevant is the net concentration of the carrier not necessarily the concentration of dopant. For example, a material may be heavily doped with n-type dopants but still have a relatively low net carrier concentration if the material is also sufficiently counter-doped with p-type dopants. As used herein concentration of dopants less than about $10^{16}/cm^3$ for silicon may be regarded as "lightly doped" and a concentration of dopants greater than $10^{18}/cm^3$ for silicon may be regarded as "heavily doped."

Introduction

In shielded gate transistor (SGT) devices, the width of the gate electrode limits the size of the source contract region when decreasing the pitch of the gates. In traditional SGT device layouts and methods of manufacture, simply decreasing the width of the gate leads to a decrease in the width of the shield. This is undesirable because the narrow shield electrode causes an increase in series resistance to the source electrode. Thus, a way to decrease the width of the source while maintaining or increasing the width of the shield electrode is highly desirable.

According to aspects of the present disclosure, a so-called "bottle shaped trench" is proposed to resolve the issues caused by current trench designs. The "bottle shaped trench" includes a region of the trench having an inversely tapered cross-section that uncouples the width of the shield electrode with the width of the gate electrode. This design allows the shield electrode to be as wide as or wider than the gate electrode allowing for design of a narrow drift region with higher doping concentration, leading to faster recovery times and a reduced series resistance from the shield electrode to the source electrode when compared to other devices having the same gate trench pitch. A narrower gate electrode at the surface allows for a wider mesa, which is desirable for scaling cell pitch without degrading the gate to source leakage or threshold voltage variation. Additionally the "bottle shaped trench" may be applied to non-SGT devices such as regular Trench FETs and provides some benefits with reduction in gate pitch.

FIG. 1 is a side cross-sectional view of the improved SGT having a shield electrode width that is equal to the width of a gate electrode according to aspects of the present disclosure. As shown, the improved SGT includes a substrate layer 101, and an epitaxial layer 102 on top of the substrate layer. The substrate layer 101 may be made of any suitable semiconductor material such as, silicon, silicon carbide, gallium nitride, or the like. The substrate layer may be heavily doped with ions of a first conductivity type where the first conductivity type is opposite a second conductivity type. By way of example and not by way of limitation, the epitaxial layer 102 may be grown using epitaxial growth or otherwise deposited on a surface of the substrate 101. The epitaxial layer 102 may be more lightly doped with ions of the first conductivity type than the substrate 101. One or more trenches 103 are located in the epitaxial layer 102. The one or more trenches may run from a top surface of the epitaxial to for example and without limitation 1 to 6 microns into the epitaxial layer. As shown, the one or more trenches 103 are so called 'bottle shaped trenches' being wider at the bottom of the trench near the substrate layer 101 than near the top of the epitaxial layer 102. That is, a distance between the opposing sidewalls near the bottom of the trench 113 is greater than the distance between the opposing sidewalls near the top of the trench 114. The distance between sidewalls at the near the top of each of the trenches may be, for example and without limitation between 0.2 and 0.3 microns. The distance between opposing sidewalls near the bottom of the trench may depend upon the voltage for example and without limitation for a low voltage device operating between 25-30 volts, the distance may be 0.8-1 micron whereas for a medium voltage device operating between 100-150 volts may 0.5-1 micron. Each of the one or more trenches may include an inverse taper region 112 wherein the distance between the opposing sidewalls increases with depth into from the top into the epitaxial layer 102. Each of the one or more trenches 103 may include a concave bottom formed in the epitaxial layer 102 near the substrate 101. Each of the one or more trenches may be lined with an insulating material forming a trench-insulating layer 104. The trench-insulating layer may be made from any dielectric material In the SGT device shown conductive material is located on the insulating layer near the bottom of trench this forms the shield electrode 105. The shield electrode-insulating layer 115 extends across the top of the shield electrode 105 and insulates the shield electrode from the gate electrode 106. Both the gate electrode and the shield electrode may be made of a conductive material for example, polycrystalline silicon. An insulating layer 108 may extend over top of the gate electrode 106 and insulate the gate electrode from the source potential. The improved shape of the one or more trenches allows for size of the shield electrode 105 to be relatively independent of the size of the gate electrode 106. As such the shield electrode can have a larger than previously developed size. For example the shield electrode may be equal in width than the to the gate electrode as shown. In prior SGT devices, the gate electrode was wider than the shield electrode and this caused higher series resistance from shield to source electrode and low break down voltages in high frequency switching implementations. By contrast, the described trenches show lower source resistances and higher breakdown voltages during high frequency switching.

The epitaxial layer 102 may also include a body region 107 doped with ions of the second conductivity type. A source region 110 may be formed over top the body region 107 and doped with ions of the first conductivity type. A source contact 111 may be formed through the insulating layer 108 and be conductively coupled with the source region 110. The source contact 111 may be formed in contact trench in the epitaxial layer and be conductive coupled to the body region 107 forming a body region short for a metal-oxide semiconductor field effect transistor (MOSFET) type device. The source contact may be conductive coupled to voltage source by a source metal layer 109 formed over the insulating layer 108. The source contact may be made from any conductive material for example and without limitation a metal such as copper, iron, aluminum, gold, silver, nickel, tungsten or any alloy or combination of metals thereof. The source metal layer may be any conductive material such as copper, aluminum, gold, silver or the like. A gate contact (not shown) may conductively couple the gate electrode 106 to a gate voltage source. The shield electrode 105 may be conductively coupled to the source voltage through a shield contact that may be in the third dimension (not shown). The increased width of the source and body regions provided by the improve trenches means that the pitch between improved trenches may be decreased. For example and without limitation the pitch may less than 0.8 microns or between 0.8 and 0.4 microns for a low voltage device, and 2-2.5 microns for a medium voltage device this represents a 20-30% decrease in pitch over prior SGT trench designs.

Figure 2:
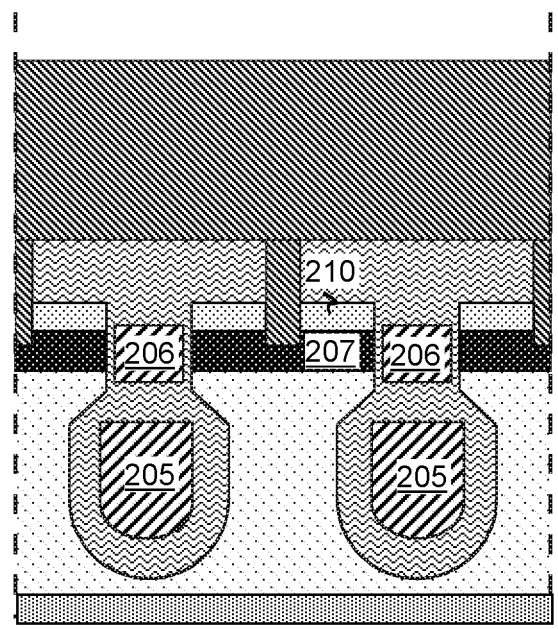
FIG. 2 depicts a side cross-sectional view of an SGT device having one or more trenches with a wider shield electrode than the gate electrode according to aspects of the present disclosure.

FIG. 2 depicts a side cross-sectional view of an SGT device having one or more trenches with a wider shield electrode than the gate electrode according to aspects of the present disclosure. As shown, each of the one or more trenches has a shield electrode 205 that is wider than the gate electrode 206. The shape of the trenches that have opposing sidewalls that are wider near a bottom than near a top enables this. This structure provides for a larger space for the shield electrode 205 while reducing the size of the gate electrode 206. A reduction in width of the gate electrode further provides for a greater horizontal width of the source region 210 and the body region 207 than prior trench designs at the same pitch.

Figure 3:
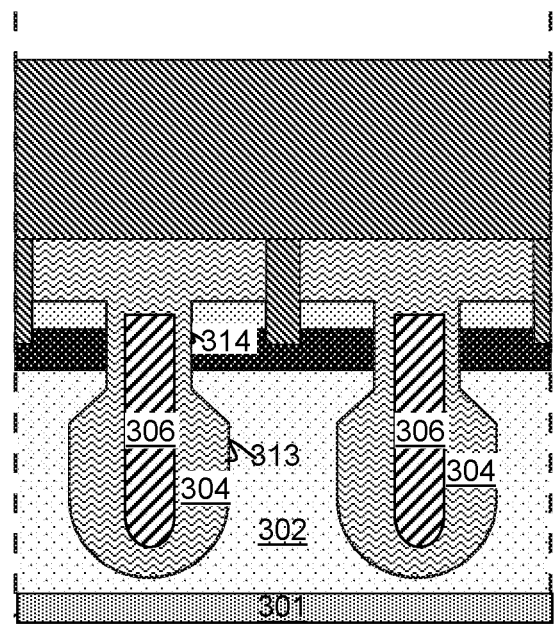
FIG. 3 shows cut-away side view schematic view of a trench Field Effect Transistor (FET) using the improved trench structure according aspects of the present disclosure.

FIG. 3 shows cut-away side view schematic view of a trench FET using the improved trench structure according aspects of the present disclosure. Similar to the SGT devices discussed above this FET includes one or more trenches that have opposing sidewalls that are wider at the bottom of the trench near the substrate layer 301 than near the top of the epitaxial layer 302. That is, a distance between the opposing sidewalls near the bottom of the trench 313 is greater than the distance between the opposing sidewalls near the top of the trench 314. Unlike the previously discussed SGT devices, this device includes gate electrodes 306 with no shield electrode structure. The gate electrode 306 in this implementation has a roughly uniform width from a top of the gate electrode near the surface of the epitaxial layer 302 to a bottom of the gate electrode near the substrate 301. The insulating layer 304, in this implementation may be thinner in the trench near the surface of the epitaxial layer 302 than near the bottom of the trench near the substrate 301. This trench FET device is suitable for low frequency switching application and includes the benefit of gate electrode of uniform width, which allows a reduction in gate trench pitch due to the improved trench shape.

Figure 4:
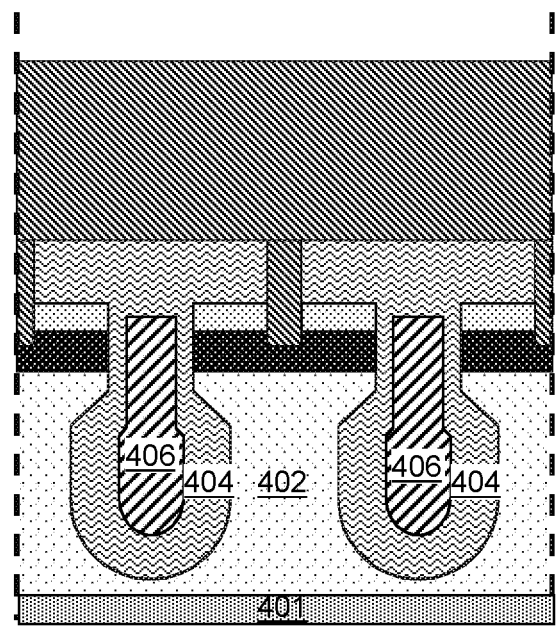
FIG. 4 depicts cut-away side view schematic view of a trench FET having the improved trench and gate electrode structure according to aspects of the present disclosure.

FIG. 4 depicts cut-away side view schematic view of a trench FET having the improved trench and gate electrode structure according to aspects of the present disclosure. The implementation shown is similar to the one shown in FIG. 3. Here the gate electrode 406 is wider near the bottom of the trench near the substrate 401 than near the top of the trench near the top of the epitaxial layer 402. This trench structure and gate electrode structure allows for a larger gate electrode and an even smaller pitch without decreasing the size decreasing the size of the source regions.

Method of Fabrication

Figure 5A:
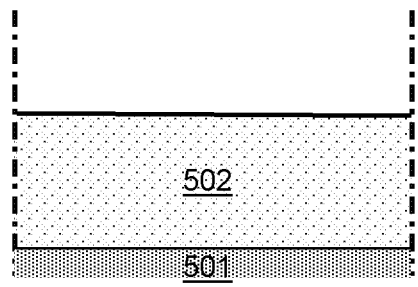
FIGS. 5A-5N depicts side cut-away views of the formation of the improved trench according to aspects of the present disclosure.
Figure 5B:
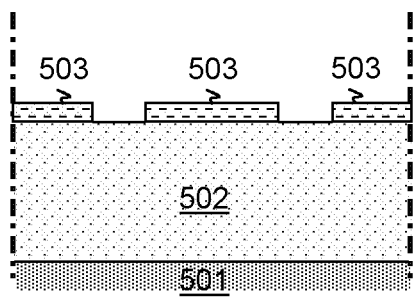
FIGS. 5O-5V depicts side cut-away views of the method of making the improved SGT according to aspects of the present disclosure.
Figure 5C:
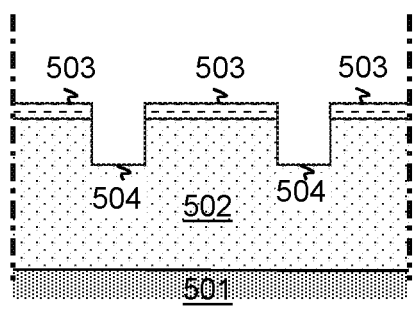
Figure 5D:
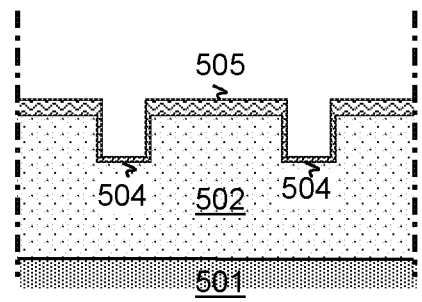
Figure 5E:
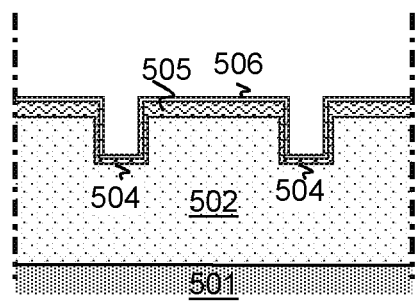
Figure 5F:
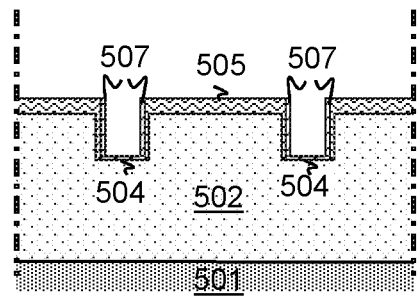
Figure 5G:
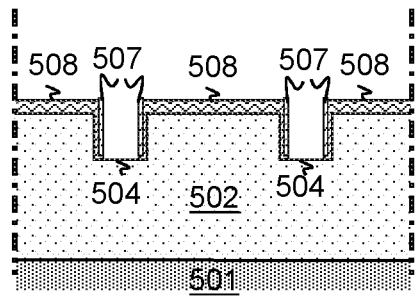
Figure 5H:
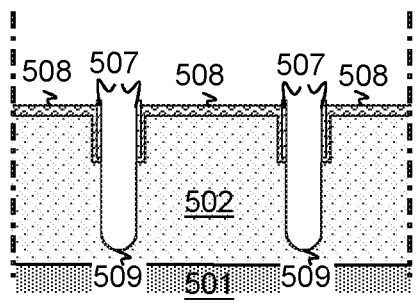
Figure 5I:
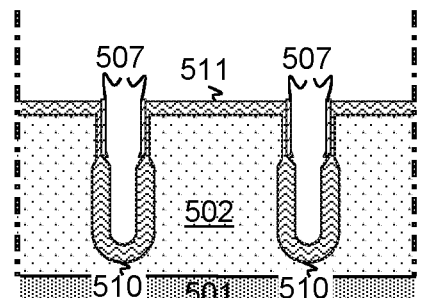
Figure 5J:
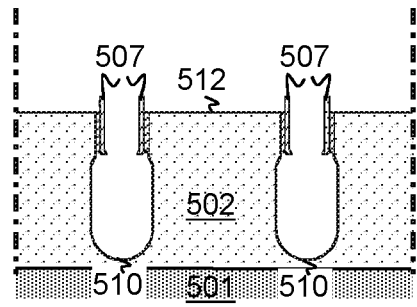
Figure 5K:
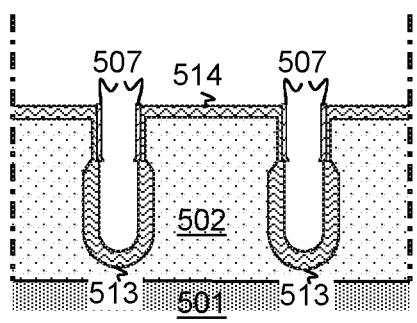
Figure 5L:
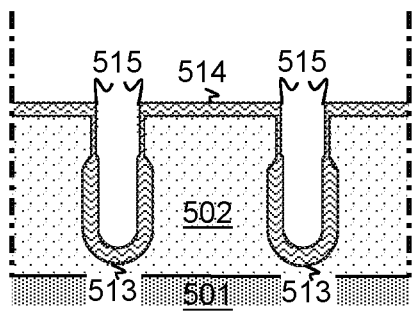
Figure 5M:
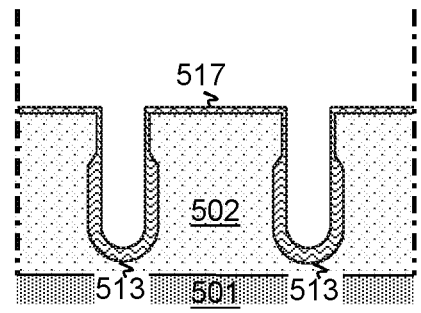
Figure 5N:
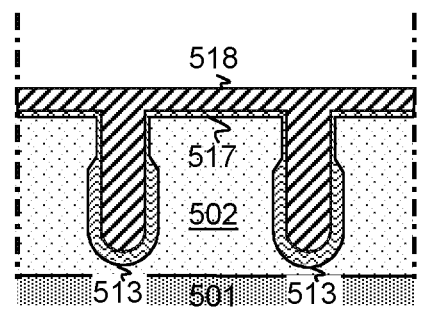
Figure 5O:
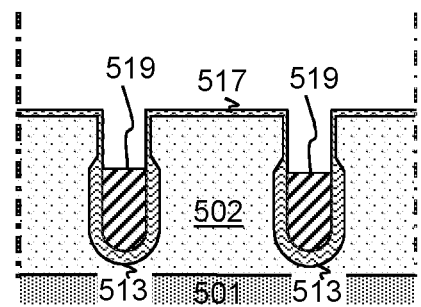

FIGS. 5A-5N depicts side cut-away views of the formation of the improved trench according to aspects of the present disclosure. FIGS. 5O-5V depict side cut-away views of the method of making an improved SGT according to aspects of the present disclosure. FIGS. 5O'-5S' depict side cut-away views of the method of making an improved FET device according to aspects of the present disclosure.

FIG. 5A shows a side cut-away view of the substrate and epitaxial layer for the device having an improved trench structure according to aspects of the present disclosure. Initially an epitaxial layer 502 is grown on the surface of a substrate layer 501. The substrate layer 501 may be heavily doped with ions of a first conductivity type. The epitaxial layer 502 may be grown or deposited on a surface of the substrate by epitaxial processes and may be more lightly doped with ions of the first conductivity type than the substrate. The epitaxial layer may be doped on gradient such that in the completed device charge balance may be achieved in combination with the thick insulation in the improved SGT trenches.

After formation of the epitaxial layer 502, a trench hard mask 503 is formed on the top surface of the epitaxial layer 502 as shown in FIG. 5B. The trench hard mask 503 may be a Silicon Nitride hard mask formed by deposition such as thermal deposition on top of a thin oxide. The trench hard mask 503 may be patterned using photolithographic techniques or mechanical masking. An etching process such as a plasma dry etch or wet etching using phosphoric acid or other selective etchant may be applied to the mask pattern to pattern the hard mask. As shown, the hard mask may be etched away at trench locations revealing the epitaxial layer 502.

As shown in FIG. 5C the epitaxial layer 502 is then etched to a desired depth through the gaps in the hard mask 503 at the trench locations forming trench precursors 504. Plasma etching techniques such as deep reactive ion etching (DRIE) may be used to create the trench precursors 504 in the epitaxial layer 502. The depth of these trench precursors 504 will decide the depth of the 'neck' portion, having a smaller width than the bottom portion of the 'bottle-shaped trenches.' Thus for low voltage (25-30V) devices these trench precursors may be around 0.2-0.4 microns in depth and for medium voltage (100-150V) around 0.8-1.2 microns.

Next, the hard mask 503 may be removed and a pad oxide 505 may be applied to the top surface of the epitaxial layer 502 as shown in FIG. 5D. The pad oxide 505 coats the top of the epitaxial layer 502 as well as sides and bottom of the trench precursors 504. Any isotropic oxidation process, for example and without limitation, thermal oxidation, may form the pad oxide 505. As shown in FIG. 5E a nitride layer 506 is formed on top of the pad oxide 505. The nitride layer coats the exposed surface of the pad oxide 505 on top of the epitaxial layer and on the sides and bottom of the trench precursors 504. A deposition process such as chemical vapor deposition may form the nitride layer 506.

After formation of the nitride layer 506, an anisotropic etch may be applied to surfaces of the nitride layer over the oxide layer 505 on the epitaxial layer 502 to create a nitride spacer 507 on the sides of the trench precursors 504. The anisotropic etch removes the nitride layer from the top surface of the oxide layer and the oxide layer on the bottom of the trench precursors 504 leaving a side nitride spacer 507 on the sides of the trench precursors 504 as shown in FIG. 5F. The nitride spacer 507 may be formed by any anisotropic etching process suitable for silicon nitride for example and without limitation nitride RIE. The nitride spacer prevents etching at the sidewalls of the trench creating a narrower top portion. The nitride spacer may extend, for example and without limitation 0.2-0.8 microns into the trench in the epitaxial layer for low voltage devices (25-30V) and for medium voltage (100-150V) around 0.5-1.5 microns.

After formation of the nitride spacer 507, the oxide layer at the bottom of the trench precursors 504 is removed as shown in FIG. 5G. The oxide layer may be removed from the bottom of the trench precursors leaving a remaining oxide layer on the surface and sides 508 by any suitable wet etching process for example and without limitation, a Hydrofluoric acid (HF) wet dip. Next, as depicted in FIG. 5H, the bottom of the trench precursors are etched away creating deep trench precursors 509. Any known deep trench etching technique, for example and without limitation DRIE, may be used to deepen the bottoms of the trench precursors to create deep trench precursors 509. The remaining oxide layer 508 may act as a mask, preventing etching in areas of the epitaxial layer 502 that are not the trench precursors.

A Local oxidation of Silicon (LOCOS) process is then applied to the deep trench precursors 509 resulting in a conversion of the epitaxial layer into silicon dioxide and growth of silicon dioxide layer in the deep trench precursors resulting in the expanded trench precursors 510. As shown in FIG. 5I the LOCOS converts some of the epitaxial layer into silicon dioxide and deposits some oxide into the trench. The conversion of epitaxial layer into silicon dioxide may be used to enlarge the trench precursors as will be shown. Additionally LOCOS expands the oxide layer on the top surface of the epitaxial layer 511. An isotropic etching process may then remove the oxide layer of the expanded trench precursors 510. Any suitable isotropic etching process may be used for example and without limitation, a wet etch with hydrofluoric acid. The result is that both the epitaxial layer that was converted to silicon dioxide and the silicon dioxide deposited in the trench is removed deepening and widening the expanded trench precursors 510. As shown, the nitride spacers 507 protects the upper portion of the expanded trench precursor 510 from etching, creating a narrower neck in an areas of the trench closer to the opening of the trench and the top surface of the epitaxial layer 512. The isotropic etch also exposes the top surface of the expanded epitaxial layer 512. This process allows expansion of the trench precursors and creation of a 'neck' for bottle shaped trenches.

The expanded trench precursors 510 may be further widened and deepened by repetition of the LOCOS process and etching. Once the desired depth and width of the lower portion of the trench precursors has been reached, a final LOCOS process may be performed as shown in FIG. 5K. The LOCOS process creates a thick oxide lining in trenches 513. Not here that the final trench 513 depth and bottom area width is achieved with this final LOCOS oxidation. The LOCOS also creates a thick layer of Silicon Dioxide 514 on the top surface of the epitaxial layer 502. The nitride spacers 507 prevent the LOCOS near the top of trench creating the final width of the upper portion of the trench. The LOCOS and etching may be repeated as many times as necessary to create final width near the bottom of the trench for example and without limitation the process may be repeated to create a width between sidewalls of the trench is 0.05-0.2 micron for low voltage devices and 0.5-1 micron for medium voltage devices. This nitride spacer 507 prevents etching near the top of the trench creating a final width between 0.2-0.3 microns. Additionally the final depth of the trench from the top epitaxial layer 502 is achieved by the repetitive LOCOS and etching, the depth may be, for example and without limitation 1 to 5 or 6 microns. This repetition further produces an inverse taper from the 'neck' near the top of the trench to the area near the bottom of the trench. The inverse taper area allows the improved trench design to be narrower near the top and wider near the bottom. The slope of the inverse taper depends on the difference in widths between the narrow neck and the width near the bottom of the trench.

After the final LOCOs step, the nitride spacers are removed 515 as shown in FIG. 5L. The nitride spacer may be removed by an isotropic nitride etching processes such as for example and without limitation, a hydrofluoric wet etch. The oxide layer under the spacers 515 remains after the nitride spacers are removed.

As depicted in FIG. 5M after removal of the nitride spacers another isotropic oxide etch is applied to the thick oxide layer. The isotropic etch reduces the thickness of the oxide layer 517 covering the top of the epitaxial layer 502 and brings the oxide layer in the trenches 513 to its final thickness. The isotropic oxide etch may be any suitable oxide etch such as a wet etch using hydrofluoric acid.

A conductive material such as, without limitation, polycrystalline silicon may be deposited on the surface of the top oxide layer 517 and in the trenches 513 as shown in FIG. 5N. The conductive material 518 may be deposited by any suitable material deposition method such as, and without limitation, Chemical Vapor Deposition (CVD) or Physical Vapor Deposition (PVD). The conductive material 518 in this implementation will eventually form the shield electrode. Note that in the other implementations discussed in FIGS. 5O'-5S' this deposition of conductive material 518 will eventually form the gate electrode.

Improved SGT Device

Figure 5P:
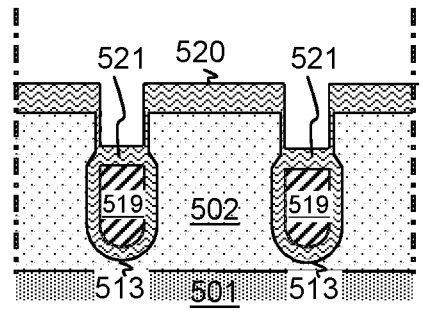
Figure 5Q:
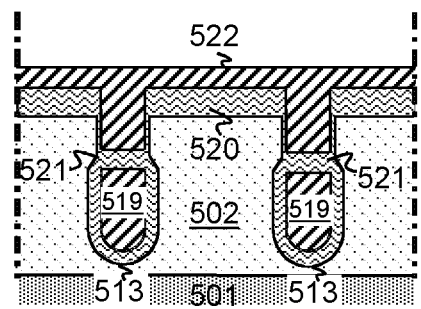

In formation of the SGT device as depicted in FIG. 5O, after deposition, the conductive material is etched away from the oxide layer 517 on the top surface of the epitaxial layer 502. The etch depth is configured to etch the surface of the deposited conductive material while leaving shield electrodes 519 in the trenches 513. The depth may be chosen to create the shield electrode 519 at a desired depth within the trench 513. The etch process used may be any suitable selective etch that preferentially etches the conductive material 518 at a much greater rate than the oxide layer 517. The depth of etch may controlled by the duration of the etch process. Next as shown in FIG. 5P, a shield electrode-insulation layer 521 is formed on over the conductive material of the shield electrode 519. The shield electrode-insulation layer 521 may be created from silicon dioxide or other dielectric material. A deposition process such as plasma-enhanced chemical vapor deposition (PECVD) may form the shield electrode-insulation layer 521. Additionally the deposited silicon dioxide thickens the top oxide layer 520. Another conductive layer 522, for example and without limitation, polycrystalline silicon may be deposited over the thick top oxide layer 520 and the shield electrode-insulation layer 521 in the trench 513 as depicted in FIG. 5Q. This conductive layer 522 will form the gate electrode for the SGT device. Any suitable deposition process may be used to create the conductive layer 522 for example and without limitation CVD or PVD. By way of example, and not by way of limitation, the conductive layer 522 may be a layer of polycrystalline silicon (polysilicon or poly). Note here that, while in the figures shown the shield electrode 519 and the gate electrode 523, have generally the same width, other implementations are not so limited, the shield electrode 519 in many other implementations may be wider than the gate electrode 523. This may be achieved by repetition of the LOCOS and etching process described above.

Figure 5R:
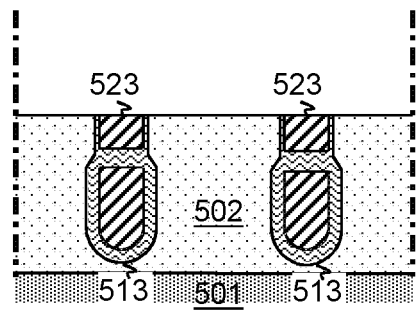
Figure 5S:
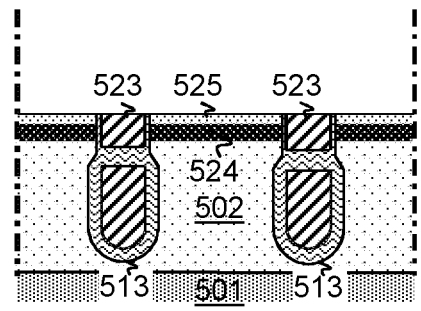

Next as shown in FIG. 5R, the conductive layer 522 and oxide layer 520 on the top surface of the epitaxial layer 502 are removed, revealing the underlying epitaxial layer. The height of the gate electrode 523 is also reduced. The conductive layer and oxide layer may be removed by any suitable method such as, without limitation, planarization and polishing. With the top of the epitaxial layer 502 exposed, the body regions 524 and source regions 525 may be implanted into the epitaxial layer as shown in FIG. 5S. The body region 524 may be doped with ions of the second conductivity type and may be formed in the epitaxial 502 through, for example and without limitation a blanket implantation of suitable ions with an energy of implantation of 50 to 150 KeV. The source region 525 may be formed in the body region or in an un-doped region of the epitaxial layer above the body region. The source region 525 may be heavily doped with ions of the first conductivity type. The source region 525 may be created by any doping method, for example and without limitation, ion implantation with an energy of implantation of 20 to 80 KeV.

Figure 5T:
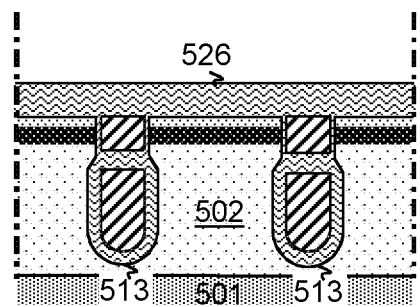
Figure 5U:
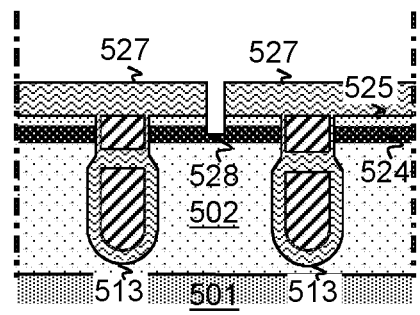
Figure 5V:
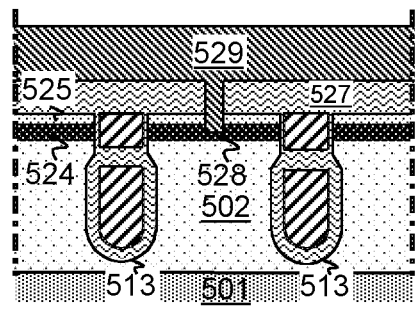
Figure 5O:
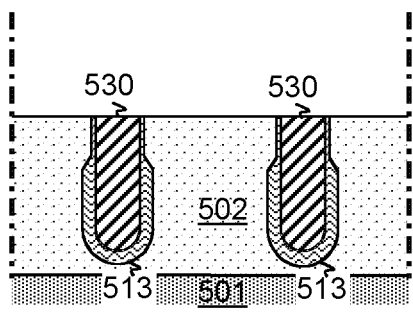
Figure 5P:
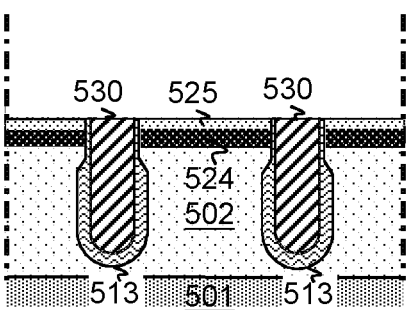
Figure 5Q:
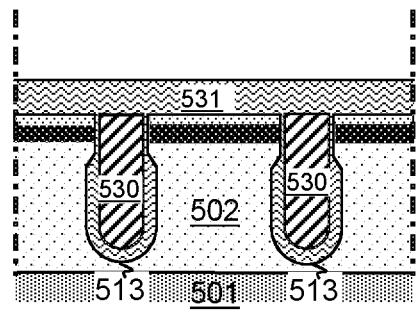
Figure 5R:
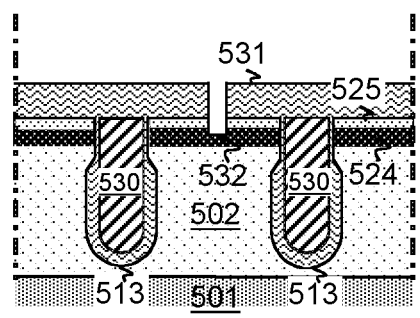
Figure 5S:
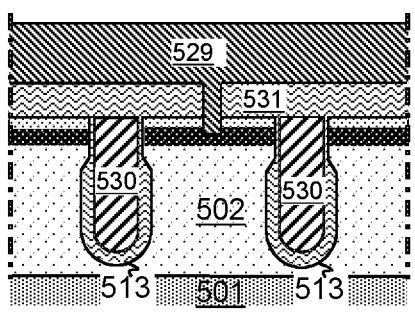

After formation of the source regions 525 and the body regions 524, the surface of the epitaxial layer 502 may be coated in an insulating material 526 as shown in FIG. 5T. The insulating material 526 may be a silicon dioxide layer or other dielectric material. The insulating material 526 may be deposited or grown on the surface of the epitaxial layer 502 and over the trenches 513 by any suitable method. For example and without limitation, the insulating material 526 may be grown by LOCOS or blanket deposited by CVD or PVD. The insulating material 526 may then be masked and etched to create openings 528 for formation of contacts to the source region 525 and a short to the body region 524 as well as the final form of the insulating layer 527 as depicted in FIG. 5U. The mask may be any suitable mask for patterning and etching the insulating layer for example a photolithographic mask or mechanically applied mask. The openings 528 may be created using a suitable etching method such as a RIE. The mask may then be removed by any suitable method for example chemical washing, plasma etching and/or planarization. Finally as shown in FIG. 5V, a source metal layer 529 is formed on top of the insulating layer 527. The source metal layer 529 fills the openings in the insulating layer 527 and forms conductive contacts with the source region 525 and the body region 525. The source metal 529 may be made from any suitable conductive material such as, copper, aluminum, tungsten, iron, nickel or any silicide or any alloy thereof. In some implementations, the source metal 529 may include thin layer of barrier metal, such as titanium nitride (TiN) that lines the insulating layer 527 and the openings 528 and a much thicker bulk metal layer. The barrier metal inhibits diffusion between the bulk metal and the doped epitaxial layer 502. The conductive material that forms the source metal 529 may be formed on the surface of the insulating material with a metal layer mask. The metal layer mask (not shown), may be applied to the insulating layer 527 before application of the conductive material layer 529. The mask may pattern the metal to form source contact regions. Additionally the mask may also be patterned for the creation of gate contacts (not shown). Conductive material may also form the gate contact, which is conductively coupled to the gate electrode. After application of the source metal layer the metal layer mask may be removed by for example and without limitation chemical washing.

Improved Trench FET

FIGS. 5O' through 5S' depict a method of making a trench FET with the improved trench shape according to aspects of the present disclosure. FIG. 5O' depicts a cut away side view of the FET device in the process of manufacture. Unlike in FIG. 5O, where the conductive material is etched to a desired shield electrode depth, here the top surface of the epitaxial, the insulating material and the conductive material are removed, leveling the top of the conductive material 530 to the surface of the epitaxial layer 502. The conductive material 530 in the trenches 513 subsequently forms the gate electrode for the FET device as discussed below. Insulating material and excess conductive material may be removed by any suitable method such as by planarization or machining. While the gate electrode shown here has a uniform thickness implementations according to aspects of the present disclosure are not so limited. Specifically, the gate electrode in some implementations may be wider near the bottom than near the top of the trenches.

FIG. 5P' depicts creation of the body region 524 and the source region 525 in the trench FET device with improved trench shape according to aspects of the present disclosure. The body regions 524 and source regions 525 may be implanted into the epitaxial layer as shown. The body region 524 may be doped with ions of the second conductivity type and may be formed in the epitaxial 502 through, for example and without limitation ion implantation. The source region 525 may be formed in the body region or in an un-doped region of the epitaxial layer above the body region. The source region 525 may be heavily doped with ions of the first conductivity type. The source region 525 may be created by any doping method for example and without limitation ion implantation.

After formation of the source regions 525 and body regions 524 the surface of the epitaxial layer 502 may be coated in an insulating material 531 as shown in FIG. 5Q'. The insulating material 531 may be a silicon dioxide layer or other dielectric material. The insulating material 531 may be deposited or grown on the surface of the epitaxial layer 502 and gate electrode 530 by any suitable method for example and without limitation LOCOS, CVD or PVD, as discussed above. The insulating material 531 may then be masked and etched to create openings 532 in the insulating layer for contacts to the source region 525 and body region 524 short as well as the final form of the insulating layer 527 as depicted in FIG. 5R'. The mask may be any suitable mask for patterning and etching the insulating layer for example a photolithographic mask or mechanically applied mask. The openings 532 may be created by a suitable etching method such as a RIE. The mask may be removed by any suitable method for example chemical washing, plasma etching and/or planarization. Finally as shown in FIG. 5S', a source metal layer 529 is formed on top of the insulating layer 531. The source metal layer 529 fills the openings 532 in the insulating layer 531 and forms conductive contacts with the source region 525 and the body region 524. The material of the source metal 529 may be any suitable conductive material such as, copper, aluminum, tungsten, iron, nickel or any silicide or any alloy thereof and may include a barrier layer, as discussed above. The conductive material of the source metal layer 529 may be formed on the surface of the insulating material with a metal layer mask. The metal layer mask may be applied to the insulating layer 531 before application of the conductive material of the source metal layer 529. The mask may pattern the metal to form source contact regions. Additionally the mask may also be patterned for the creation of gate contacts (not shown). Conductive material may also form the gate contact, which is conductively coupled to the gate electrode. After application of the source metal layer the metal layer mask may be removed by for example and without limitation chemical washing.

With the above described method of making the two or more of the improved trenches may be place formed in the epitaxial layer with a pitch of is 0.8 microns or less or between 0.8 and 0.4 microns for a low voltage device, and 2-2.5 microns for a medium voltage device. This represents a 20-30% decrease in pitch over prior trench designs.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC § 112, ¶6.

What is claimed is:

1. A device comprising:
a semiconductor substrate layer;
an epitaxial layer on the semiconductor substrate;
one or more trenches in the epitaxial layer, each trench having a pair of opposing sidewalls, wherein a distance between the opposing sidewalls is greater near a bottom of the trench than near a top of the trench, wherein the bottom of the trench is closer to the semiconductor substrate layer than the top of the trench;
a trench-insulating layer lining each of the one or more trenches in the epitaxial layer; and
a conductive material layer formed on the trench-insulating layer in each of the one or more trenches in the epitaxial layer wherein a distance between opposing sides of the conductive material is greater near the bottom of the one or more trenches than near a top of the one or more trenches.

2. The device of claim 1 wherein each trench of the one or more trenches includes a bottom that is concave.

3. The device of claim 1 wherein the pair of opposing sidewalls include an inverse taper region wherein the distance between the opposing sidewalls increases with depth from the top into the epitaxial layer.

4. The device of claim 1 wherein the conductive material layer includes a gate electrode that is conductively coupled to a gate contact.

5. A device comprising:
a semiconductor substrate layer;
an epitaxial layer on the semiconductor substrate;
one or more trenches in the epitaxial layer, each trench having a pair of opposing sidewalls, wherein a distance between the opposing sidewalls is greater near a bottom of the trench than near a top of the trench, wherein the bottom of the trench is closer to the semiconductor substrate layer than the top of the trench;
a trench-insulating layer lining each of the one or more trenches in the epitaxial layer; and
a conductive material layer formed on the trench-insulating layer in each of the one or more trenches in the epitaxial layer wherein the conductive material layer formed on the trench-insulating layer includes a shield electrode formed near the bottom of the one or more trenches, the device further comprising gate insulating layer on top of the shield electrode and a gate electrode on top of the gate insulating layer, wherein the gate insulating layer is comprised of an insulating material and the gate electrode is made of a conductive material.

6. The device of claim 5 wherein a width of the gate electrode is less than a width of the shield electrode.

7. The device of claim 6 wherein the width of the gate electrode is a distance between opposing sides of the gate electrode and the width of the shield electrode is a distance between opposing sides of the shield electrode, wherein each of the opposing side walls of the gate electrode has a corresponding side wall of the shield electrode on the same side of the one or more trenches.

8. The device of claim 5 wherein a width of the gate electrode is equal to a width of the shield electrode.

9. The device of claim 1 wherein the one or more trenches includes two or more trenches wherein the pitch between trenches is 0.8 microns or less.

* * * * *